(12) United States Patent
Sasaki et al.

(10) Patent No.: US 8,168,515 B2
(45) Date of Patent: May 1, 2012

(54) METHOD FOR MANUFACTURING SEMICONDUCTOR SUBSTRATE

(75) Inventors: Makoto Sasaki, Itami (JP); Shin Harada, Osaka (JP); Taro Nishiguchi, Itami (JP); Shinsuke Fujiwara, Itami (JP); Yasuo Namikawa, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 13/062,057

(22) PCT Filed: Apr. 27, 2010

(86) PCT No.: PCT/JP2010/057441
§ 371 (c)(1),
(2), (4) Date: Mar. 3, 2011

(87) PCT Pub. No.: WO2010/131569
PCT Pub. Date: Nov. 18, 2010

(65) Prior Publication Data
US 2011/0165764 A1    Jul. 7, 2011

(30) Foreign Application Priority Data

May 11, 2009   (JP) ................ 2009-114737
Sep. 24, 2009  (JP) ................ 2009-219065
Oct. 1, 2009   (JP) ................ 2009-229764
Oct. 29, 2009  (JP) ................ 2009-248621

(51) Int. Cl.
H01L 21/20        (2006.01)

(52) U.S. Cl. .... 438/478; 438/455; 438/503; 257/E21.09

(58) Field of Classification Search ............... 438/455, 438/478, 503
See application file for complete search history.

(56) References Cited

U.S. PATENT DOCUMENTS

| | | |
|---|---|---|
| 6,153,166 A | 11/2000 | Tanino |
| 6,734,461 B1 | 5/2004 | Shiomi et al. |
| 7,314,520 B2 | 1/2008 | Powell et al. |
| 7,718,519 B2 * | 5/2010 | Takahashi et al. ........... 438/522 |
| 2003/0070611 A1 * | 4/2003 | Nakamura et al. ........... 117/109 |

(Continued)

FOREIGN PATENT DOCUMENTS

JP          5-129169        5/1993

(Continued)

OTHER PUBLICATIONS

Glass, et al., "SiC Seeded Crystal Growth," Cree Research, Inc., phys. stat. sol. (b), 202, 149 (1997), pp. 149-162.

(Continued)

*Primary Examiner* — Alexander Ghyka
(74) *Attorney, Agent, or Firm* — Drinker Biddle & Reath LLP

(57) ABSTRACT

A first silicon carbide substrate having a first back-side surface and a second silicon carbide substrate having a second back-side surface are prepared. The first and second silicon carbide substrates are placed so as to expose each of the first and second back-side surfaces in one direction. A connecting portion is formed to connect the first and second back-side surfaces to each other. The step of forming the connecting portion includes a step of forming a growth layer made of silicon carbide on each of the first and second back-side surfaces, using a sublimation method of supplying a sublimate thereto in the one direction.

17 Claims, 8 Drawing Sheets

U.S. PATENT DOCUMENTS

| | | |
|---|---|---|
| 2003/0153163 A1 | 8/2003 | Letertre et al. |
| 2004/0144301 A1* | 7/2004 | Neudeck et al. .............. 117/86 |
| 2006/0113574 A1 | 6/2006 | Fujikawa et al. |
| 2007/0001175 A1 | 1/2007 | Kojima et al. |
| 2007/0032053 A1 | 2/2007 | Seki et al. |
| 2009/0072243 A1 | 3/2009 | Suda et al. |
| 2010/0093161 A1 | 4/2010 | Kusumoto et al. |
| 2011/0262680 A1* | 10/2011 | Nishiguchi et al. ............. 428/78 |
| 2011/0287603 A1* | 11/2011 | Itoh et al. .................... 438/455 |
| 2011/0300354 A1* | 12/2011 | Nishiguchi ................. 428/210 |

FOREIGN PATENT DOCUMENTS

| | | |
|---|---|---|
| JP | 10-223835 | 8/1998 |
| JP | 11-3842 | 1/1999 |
| JP | 11-29397 | 2/1999 |
| JP | 11-87200 | 3/1999 |
| JP | 11-228295 | 8/1999 |
| JP | 2000-277405 | 10/2000 |
| JP | 2002-15619 | 1/2002 |
| JP | 2002-280531 | 9/2002 |
| JP | 2003-224042 | 8/2003 |
| JP | 2005-64383 | 3/2005 |
| JP | 2005-179155 | 7/2005 |
| JP | 2005-294611 | 10/2005 |
| JP | 2006-66722 | 3/2006 |
| JP | 2006-117512 | 5/2006 |
| JP | 2006-228961 | 8/2006 |
| JP | 2008-4726 | 1/2008 |
| JP | 2008-169098 | 7/2008 |
| JP | 2008-235776 | 10/2008 |
| JP | 2008-280207 | 11/2008 |
| JP | 2009-117533 | 5/2009 |
| WO | WO 99/00538 | 1/1999 |
| WO | WO 01/18872 | 3/2001 |
| WO | WO 2004/112150 | 12/2004 |
| WO | WO 2006/114999 | 11/2006 |
| WO | WO 2008-111269 | 9/2008 |
| WO | WO 2008-120467 | 10/2008 |
| WO | WO 2010/131568 | 11/2010 |
| WO | WO 2010/131570 | 11/2010 |
| WO | WO 2010/131571 | 11/2010 |
| WO | WO 2010/131572 | 11/2010 |
| WO | WO 2010/131573 | 11/2010 |
| WO | WO 2011/037079 | 3/2011 |

OTHER PUBLICATIONS

Nakabayashi et al., "Growth of Crack-free 100mm-diameter 4H-SiC Crystals with Low Micropipe Densities," Nippon Steel Corporation, Advanced Technology Research Laboratories, Materials Science Forum, vols. 600-603 (2009), pp. 3-6.

U.S. Appl. No. 13/319,560, filed Nov. 9, 2011.
U.S. Appl. No. 13/319,599, filed Nov. 9, 2011.
U.S. Appl. No 13/375,287, filed Nov. 30, 2011.
U.S. Appl. No. 13/320,250, filed Nov. 11, 2011.
U.S. Appl. No. 13/320,247, filed Nov. 11, 2011.
U.S. Appl. No. 13/320,243, filed Nov. 11, 2011.

* cited by examiner

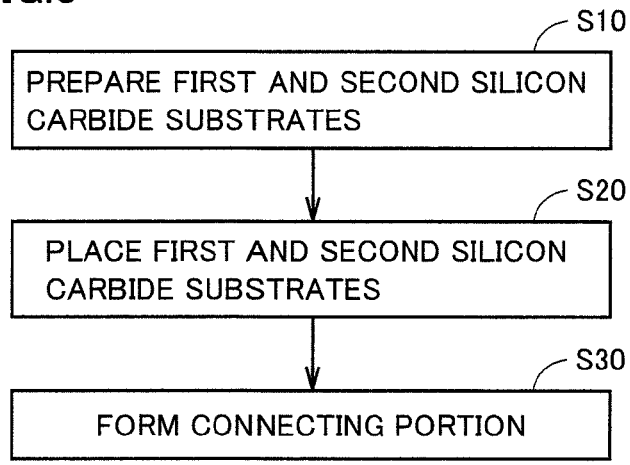
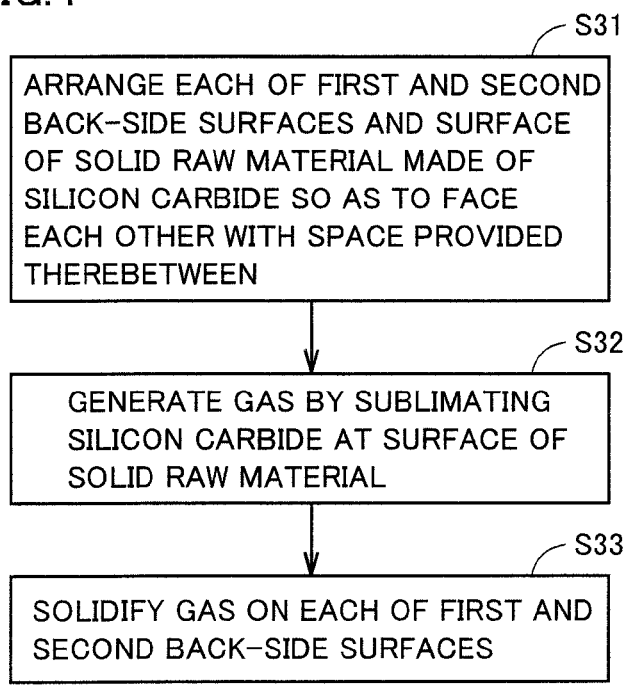

METHOD FOR MANUFACTURING SEMICONDUCTOR SUBSTRATE

TECHNICAL FIELD

The present invention relates to a method for manufacturing a semiconductor substrate, in particular, a method for manufacturing a semiconductor substrate including a portion made of silicon carbide (SiC) having a single-crystal structure.

BACKGROUND ART

In recent years, SiC substrates have been adopted as semiconductor substrates for use in manufacturing semiconductor devices. SiC has a band gap larger than that of Si (silicon), which has been used more commonly. Hence, a semiconductor device employing a SiC substrate advantageously has a large withstand voltage, low on-resistance, or have properties less likely to decrease in a high temperature environment.

In order to efficiently manufacture such semiconductor devices, the substrates need to be large in size to some extent. According to U.S. Pat. No. 7,314,520 (Patent Document 1), a SiC substrate of 76 mm (3 inches) or greater can be manufactured.

PRIOR ART DOCUMENTS

Patent Documents

Patent Document 1: U.S. Pat. No. 7,314,520

SUMMARY OF THE INVENTION

Problems to be Solved by the Invention

Industrially, the size of a SiC substrate is still limited to approximately 100 mm (4 inches). Accordingly, semiconductor devices cannot be efficiently manufactured using large substrates, disadvantageously. This disadvantage becomes particularly serious in the case of using a property of a plane other than the (0001) plane in SiC of hexagonal system. Hereinafter, this will be described.

A SiC substrate small in defect is usually manufactured by slicing a SiC ingot obtained by growth in the (0001) plane, which is less likely to cause stacking fault. Hence, a SiC substrate having a plane orientation other than the (0001) plane is obtained by slicing the ingot not in parallel with its grown surface. This makes it difficult to sufficiently secure the size of the substrate, or many portions in the ingot cannot be used effectively. For this reason, it is particularly difficult to effectively manufacture a semiconductor device that employs a plane other than the (0001) plane of SiC.

The present invention is made in the foregoing problem, and its object is to provide a method for manufacturing a semiconductor substrate for efficiently manufacturing a semiconductor device employing SiC.

Means for Solving the Problems

A method according to the present invention for manufacturing a semiconductor substrate includes the following steps.

There are prepared a first silicon carbide substrate having a first front-side surface and a first back-side surface opposite to each other and having a single-crystal structure, and a second silicon carbide substrate having a second front-side surface and a second back-side surface opposite to each other and having a single-crystal structure. The first and second silicon carbide substrates are placed so as to expose each of the first and second back-side surfaces in one direction. A connecting portion is formed for connecting the first and second back-side surfaces to each other. The step of forming the connecting portion includes a step of forming a growth layer made of silicon carbide on each of the first and second back-side surfaces, using a sublimation method of supplying a sublimate thereto in the one direction.

According to the method for manufacturing, the first and second silicon carbide substrates are combined by the connecting portion as one semiconductor substrate. This semiconductor substrate includes both the first and second front-side surfaces of the first and second silicon carbide substrates, as its substrate surface on which a semiconductor device is to be formed. Namely, this semiconductor substrate has a larger substrate surface than that in the case where either of the first and second silicon carbide substrates is used solely. Thus, the use of such a semiconductor substrate allows for efficient manufacturing of a semiconductor device that employs silicon carbide.

Further, since the growth layer formed on each of the first and second back-side surfaces is made of silicon carbide as with the first and second silicon carbide substrates, the first and second silicon carbide substrates and the growth layer have close physical properties. Accordingly, warpage or cracks of the semiconductor substrate resulting from a difference in physical property can be suppressed.

Furthermore, the use of the sublimation method allows the growth layer to be formed fast with high quality.

Although the first and second silicon carbide substrates are recited in the above description regarding the method for manufacturing, it should be appreciated that this does not exclude a case of using one or more additional silicon carbide substrates in addition to the first and second silicon carbide substrates.

In the method for manufacturing, the step of forming the growth layer preferably includes the following steps.

Each of the first and second back-side surfaces exposed in the one direction, and a surface of a solid raw material are arranged so as to face each other with a space provided therebetween, the solid raw material being disposed in the one direction relative to the first and second back-side surfaces and made of silicon carbide. A gas is generated by sublimating the silicon carbide at the surface of the solid raw material. The gas is solidified on each of the first and second back-side surfaces.

This allows the growth layer to be formed fast with high quality.

More preferably, the space has an average value smaller than a mean free path for a sublimation gas in the sublimation method. In this way, distribution in film thickness of the growth layer can be small.

In the above-described method for manufacturing, preferably, in the step of forming the growth layer, each of the first and second silicon carbide substrates has a temperature set to be lower than that of the solid raw material. This allows the sublimated silicon carbide to be efficiently solidified on the first and second silicon carbide substrates.

In the above-described method for manufacturing, the solid raw material is preferably a piece of solid matter of silicon carbide. In this case, even when growth layers are formed separately on the first and second back-side surfaces, the growth layers thus formed separately can be connected to each other by a non-sublimated portion of the piece of solid matter. This allows the first and second silicon carbide substrates to be connected to each other more securely.

More preferably, the step of placing the first and second silicon carbide substrates is performed to allow a minimum space between the first and second silicon carbide substrates to be not more than 1 mm. In this way, the growth layer can be formed to connect the first and second back-side surfaces to each other more securely.

In the above-described method for manufacturing, preferably, the growth layer has a single-crystal structure. This allows the growth layer to have physical properties close to those of the first and second silicon carbide substrates each also having a single-crystal structure.

More preferably, the growth layer on the first back-side surface has a crystal plane inclined by 10° or smaller relative to a crystal plane of the first back-side surface. The growth layer on the second back-side surface has a crystal plane inclined by 10° or smaller relative to a crystal plane of the second back-side surface. This allows the growth layer to have anisotropy close to that of each of the first and second silicon carbide substrates.

In the above-described method for manufacturing, preferably, each of the first and second silicon carbide substrates has an impurity concentration different from an impurity concentration in the growth layer. Accordingly, there can be obtained a semiconductor substrate having a structure of two layers different in impurity concentration.

In the above-described method for manufacturing, preferably, the growth layer has an impurity concentration higher than an impurity concentration of each of the first and second silicon carbide substrates. This allows the growth layer to have a resistivity smaller than those of the first and second silicon carbide substrates.

In the above-described method for manufacturing, preferably, the first front-side surface has an off angle of not less than 50° and not more than 65° relative to a {0001} plane of the first silicon carbide substrate, and the second front-side surface has an off angle of not less than 50° and not more than 65° relative to a {0001} plane of the second silicon carbide substrate. Accordingly, channel mobility in each of the first and second front-side surfaces can be higher than that in the case where each of the first and second front-side surfaces corresponds to the {0001} plane.

More preferably, the first front-side surface has an off orientation forming an angle of not more than 5° with a <1-100> direction of the first silicon carbide substrate, and the second front-side surface has an off orientation forming an angle of not more than 5° with a <1-100> direction of the second silicon carbide substrate. This achieves further improved channel mobility in each of the first and second front-side surfaces.

Further preferably, the first front-side surface has an off angle of not less than −3° not more than 5° relative to a {03-38} plane in the <1-100> direction of the first silicon carbide substrate, and the second front-side surface has an off angle of not less than −3° not more than 5° relative to a {03-38} plane in the <1-100> direction of the second silicon carbide substrate. This achieves further improved channel mobility in each of the first and second front-side surfaces.

In the above-described method for manufacturing, preferably, the first front-side surface has an off orientation forming an angle of not more than 5° with a <11-20> direction of the first silicon carbide substrate, and the second front-side surface has an off orientation forming an angle of not more than 5° with a <11-20> direction of the second silicon carbide substrate. This achieves further improved channel mobility in each of the first and second front-side surfaces, as compared with a case where each of the first and second front-side surfaces corresponds to the {0001} plane.

In the above-described method for manufacturing, preferably, the step of forming the growth layer is performed in atmosphere obtained by reducing pressure of atmospheric air.

In the above-described method for manufacturing, preferably, the step of forming the growth layer is performed in atmosphere having a pressure higher than $10^{-1}$ Pa and lower than $10^4$ Pa.

In the above-described method for manufacturing, each of the first and second back-side surfaces is a surface obtained by slicing.

Effects of the Invention

As apparent from the description above, according to the method for manufacturing the semiconductor substrate in the present invention, there can be provided a method for manufacturing a semiconductor substrate for use in efficiently manufacturing semiconductor devices that employ silicon carbide.

BRIEF DESCRIPTION OF THE DRAWINGS

FIG. 3 is a schematic flowchart of a method for manufacturing the semiconductor substrate in the first embodiment of the present invention.

FIG. 4 is a schematic flowchart of a step of forming a connecting portion shown in FIG. 3.

MODES FOR CARRYING OUT THE INVENTION

The following describes embodiments of the present invention with reference to figures.

First Embodiment

Figure 1:
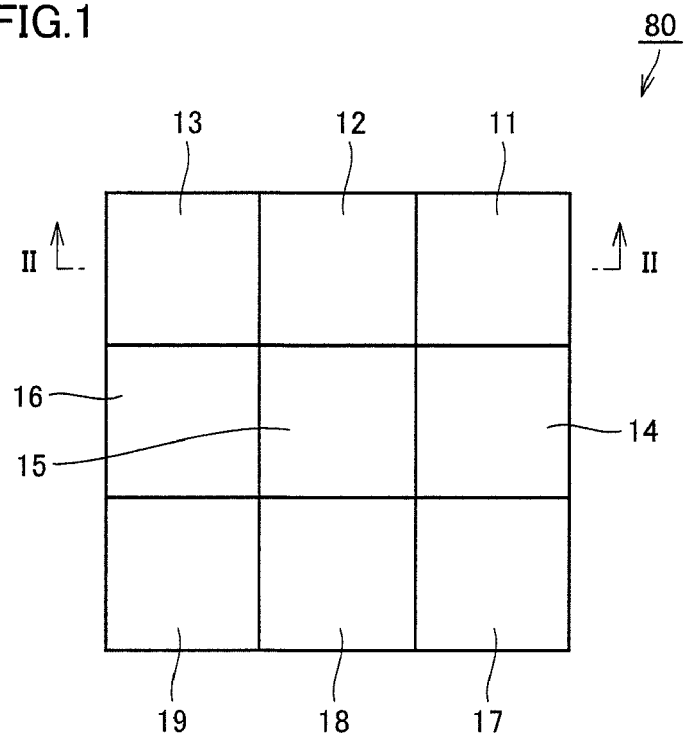
FIG. 1 is a plan view schematically showing a configuration of a semiconductor substrate in a first embodiment of the present invention.
Figure 2:
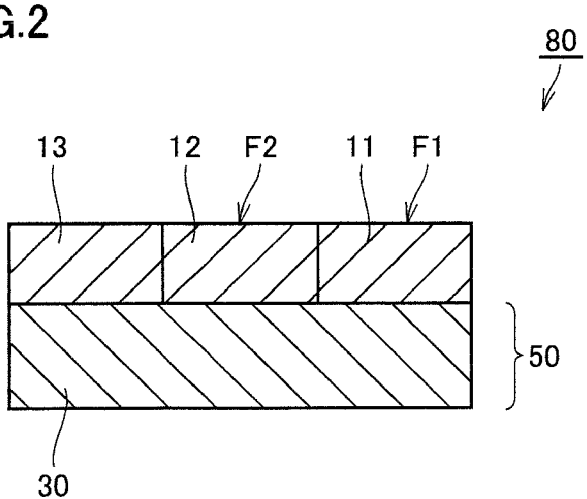
FIG. 2 is a schematic cross sectional view taken along a line II-II in FIG. 1.

Referring to FIG. 1 and FIG. 2, a semiconductor substrate 80 of the present embodiment includes a plurality of SiC substrates 11-19 (silicon carbide substrates) each having a single-crystal structure, and a connecting portion 50. Connecting portion 50 includes a growth layer 30 made of SiC, and is substantially constituted by growth layer 30 in the present embodiment. Growth layer 30 connects the back-side surfaces of SiC substrates 11-19 (surfaces opposite to the surfaces shown in FIG. 1) to one another, whereby SiC substrates 11-19 are fixed to one another. SiC substrates 11-19 respectively have exposed front-side surfaces on the same plane. For example, SiC substrates 11 and 12 respectively have front-side surfaces F1 and F2 (FIG. 2). Thus, semiconductor substrate 80 has a surface larger than the surface of each of SiC substrates 11-19. Hence, in the case of using semiconductor substrate 80, semiconductor devices employing SiC can be manufactured more effectively than in the case of using each of SiC substrates 11-19 solely.

Next, a method for manufacturing semiconductor substrate 80 of the present embodiment will be described. For ease of description, only SiC substrates 11 and 12 of SiC substrates 11-19 may be explained, but the same explanation is also applied to SiC substrates 13-19.

Figure 5:
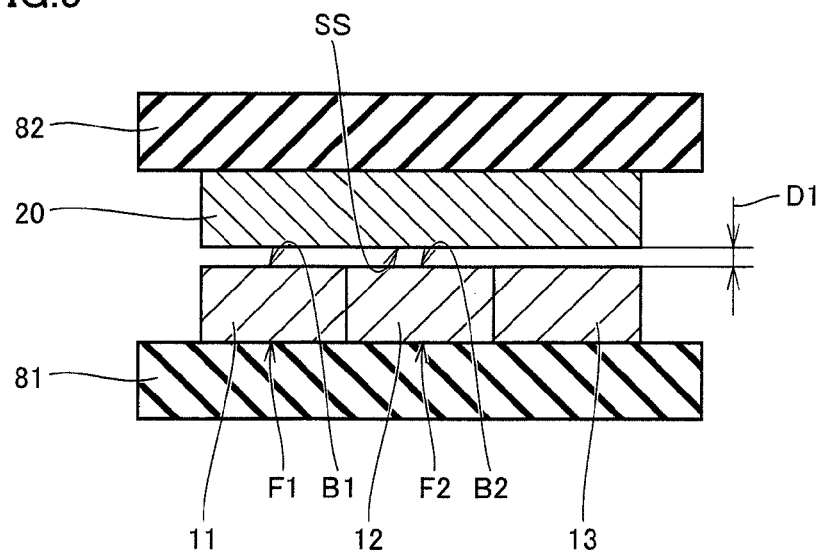
FIG. 5 is a cross sectional view schematically showing a first step of the method for manufacturing the semiconductor substrate in the first embodiment of the present invention.

Referring to FIG. 5, SiC substrate 11 (first silicon carbide substrate) and SiC substrate 12 (second silicon carbide substrate) each having a single-crystal structure are prepared (FIG. 3: step S10). SiC substrate 11 has a front-side surface F1 (first front-side surface) and a back-side surface B1 (first back-side surface) opposite to each other. SiC substrate 12 has a front-side surface F2 (second front-side surface) and a back-side surface B2 (second back-side surface) opposite to each other. Specifically, for example, SiC substrates 11 and 12 are prepared by slicing, along the (03-38) plane, a SiC ingot grown in the (0001) plane in the hexagonal system. Preferably, each of back-side surfaces B1 and B2 has a roughness Ra of not more than 100 μm. Each of back-side surfaces B1 and B2 may be a surface formed by the above-described slicing (so-called "as-sliced surface"), i.e., a surface not polished after the slicing.

Next, SiC substrates 11 and 12 are placed on a first heating body 81 in a treatment room with each of back-side surfaces B1 and B2 being exposed in one direction (upward in FIG. 5) (FIG. 3: step S20). Namely, when viewed in a plan view, SiC substrates 11 and 12 are arranged side by side.

Preferably, this arrangement is accomplished by disposing back-side surfaces B1 and B2 on the same flat plane or by disposing front-side surfaces F1 and F2 on the same flat plane.

Further, a minimum space between SiC substrates 11 and 12 (minimum space in a lateral direction in FIG. 5) is preferably 5 mm or smaller, more preferably, 1 mm or smaller, and further preferably 100 μm or smaller, and particularly preferably 10 μm or smaller. Specifically, for example, the substrates, which have the same rectangular shape, may be arranged in the form of a matrix with a space of 1 mm or smaller therebetween.

Next, connecting portion 50 (FIG. 2) is formed to connect back-side surfaces B1 and B2 to each other (FIG. 3: step S30). This step of forming connecting portion 50 includes a step of forming growth layer 30 (FIG. 2). For the step of forming growth layer 30, a sublimation method, preferably, a close-spaced sublimation method is used. The following describes the step of forming connecting portion 50 in detail.

First, each of back-side surfaces B1 and B2 exposed in the one direction (upward in FIG. 5) and a surface SS of a solid raw material 20 disposed in the one direction (upward in FIG. 5) relative to back-side surfaces B1 and B2 are arranged to face to face with a space D1 provided therebetween (FIG. 4: step S31). Preferably, space D1 has an average value smaller than a mean free path for a sublimation gas in the sublimation method, for example, is 1 μm or greater and 1 cm or smaller. This sublimation gas is a gas formed by sublimation of solid SiC, and includes Si, $Si_2C$, and $SiC_2$, for example.

Solid raw material 20 is made of SiC, and is preferably a piece of solid matter of silicon carbide, specifically, a SiC wafer, for example. Solid raw material 20 is not particularly limited in crystal structure of SiC. Further, surface SS of solid raw material 20 preferably has a roughness Ra of 1 mm or smaller.

Figure 8:
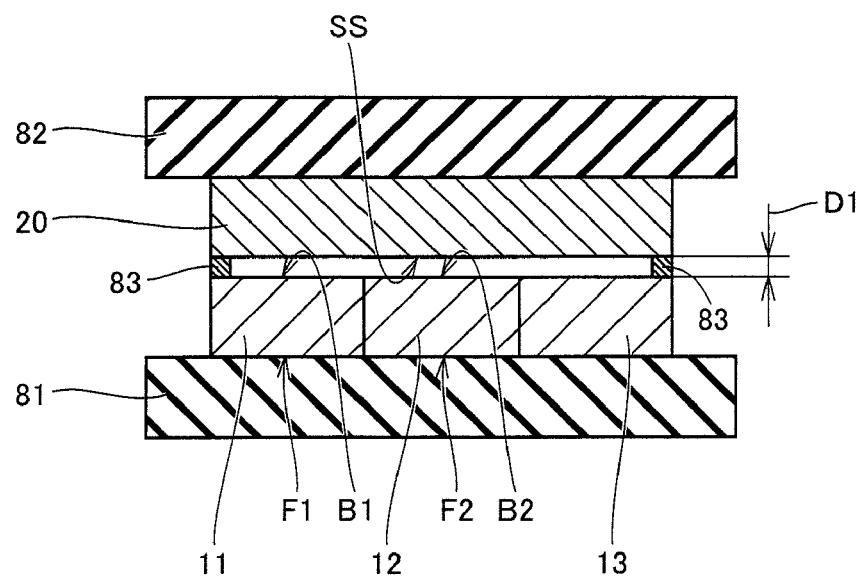
FIG. 8 is a cross sectional view schematically showing a first variation of the first step of the method for manufacturing the semiconductor substrate in the first embodiment of the present invention.

In order to provide space D1 (FIG. 5) more securely, there may be used spacers 83 (FIG. 8) each having a height corresponding to space D1. This method is particularly effective when the average value of space D1 is approximately 100 μm.

Next, SiC substrates 11 and 12 are heated by first heating body 81 to a predetermined substrate temperature. On the other hand, solid raw material 20 is heated by a second heating body 82 to a predetermined raw material temperature. When solid raw material 20 is thus heated to the raw material temperature, SiC is sublimated at surface SS of the solid raw material to generate a sublimate, i.e., gas (FIG. 4: step S32). The gas thus generated is supplied onto back-side surfaces B1 and B2 in the one direction (from upward in FIG. 5).

Preferably, the substrate temperature is set lower than the raw material temperature, and is more preferably set so that a difference between the temperatures is 1° C. or greater and 100° C. or smaller. Further, the substrate temperature is preferably 1800° C. or greater and 2500° C. or smaller.

Figure 6:
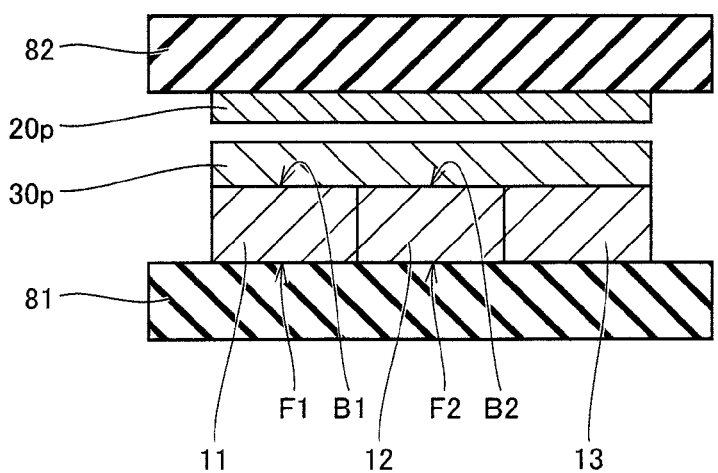
FIG. 6 is a cross sectional view schematically showing a second step of the method for manufacturing the semiconductor substrate in the first embodiment of the present invention.

Referring to FIG. 6, the gas supplied as described above is solidified and accordingly recrystallized on each of back-side surfaces B1 and B2 (FIG. 4: step S33). In this way, a growth layer 30p is formed to connect back-side surfaces B1 and B2 to each other. Further, solid raw material 20 (FIG. 5) is consumed and is reduced in size to be a solid raw material 20p.

Figure 7:
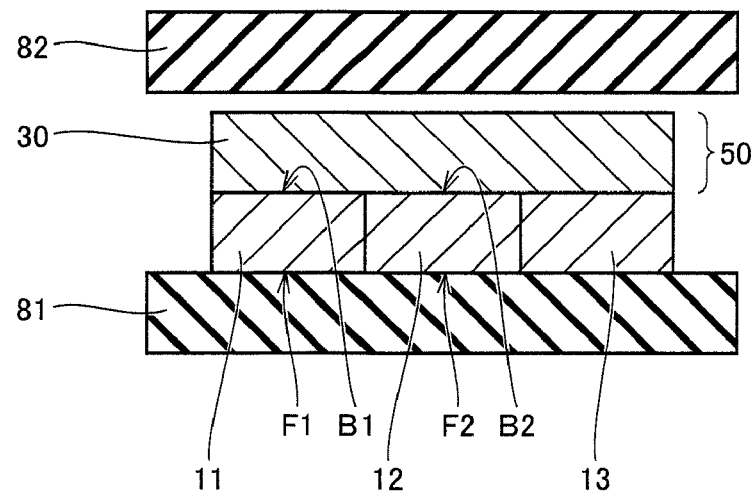
FIG. 7 is a cross sectional view schematically showing a third step of the method for manufacturing the semiconductor substrate in the first embodiment of the present invention.

Referring to FIG. 7 mainly, as the sublimation develops, solid raw material 20p (FIG. 6) is run out. Accordingly, growth layer 30 is formed to serve as connecting portion 50 for connecting back-side surfaces B1 and B2 to each other.

Upon the formation of growth layer 30, the atmosphere in the treatment room may be obtained by reducing pressure of atmospheric air. In this case, the pressure of the atmosphere is preferably higher than $10^{-1}$ Pa and is lower than $10^4$ Pa.

The atmosphere may be an inert gas. An exemplary inert gas usable is a noble gas such as He or Ar; a nitrogen gas; or a mixed gas of the noble gas and nitrogen gas. When using the mixed gas, a ratio of the nitrogen gas is, for example, 60%. Further, the pressure in the treatment room is preferably 50 kPa or smaller, and is more preferably 10 kPa or smaller.

Further, growth layer 30, including growth layer 30p, preferably has a single-crystal structure. More preferably, growth layer 30 on back-side surface B1 has a crystal plane inclined by 10° or smaller relative to the crystal plane of back-side surface B1, or growth layer 30 on back-side surface B2 has a crystal plane inclined by 10° relative to the crystal plane of back-side surface B2. These angular relations can be readily realized by epitaxially growing growth layer 30 on back-side surfaces B1 and B2.

The crystal structure of each of SiC substrates 11, 12 is preferably of hexagonal system, and is more preferably 4H—SiC or 6H—SiC. Moreover, it is preferable that SiC substrates 11, 12 and growth layer 30 be made of SiC single crystals having the same crystal structure.

When the SiC substrates (SiC substrates 11, 12, and the like) and growth layer 30 are made of the SiC single crystals having the same crystal structure, there may be a difference in crystallographic property therebetween. Examples of such a property include defect density, crystal quality, and impurity concentration. Hereinafter, this will be described.

Growth layer 30 may have a defect density larger than those of SiC substrates 11-19. Hence, connecting portion 50 substantially constituted by growth layer 30 can be formed readily irrespective of its size being larger than the size of each of SiC substrates 11-19. Specifically, growth layer 30 may have a micro pipe density larger than those of SiC substrates 11-19. Further, growth layer 30 may have a threading screw dislocation density larger than those of SiC substrates 11-19. Further, growth layer 30 has a threading edge dislocation density larger than those of SiC substrates 11-19. Further, growth layer 30 has a basal plane dislocation density larger than those of SiC substrates 11-19. Further, growth layer 30 has a composite dislocation density larger than those of SiC substrates 11-19. Further, growth layer 30 has a stacking fault density larger than those of SiC substrates 11-19. Further, growth layer 30 has a point defect density larger than those of SiC substrates 11-19.

Further, the quality of the crystal of growth layer 30 may be lower than those of the crystals of SiC substrates 11-19. Hence, connecting portion 50 substantially constituted by growth layer 30 can be formed readily irrespective of its size being larger than the size of each of SiC substrates 11-19. Specifically, growth layer 30 has a larger half width in an X-ray rocking curve than those of SiC substrates 11-19.

Further, the concentration in each of SiC substrates 11 and 12 is preferably different from the impurity concentration of growth layer 30. More preferably, growth layer 30 has an impurity concentration higher than that of each of SiC substrates 11 and 12. It should be noted that the impurity concentration in each of SiC substrates 11, 12 is, for example, $5 \times 10^{16}$ cm$^{-3}$ or greater and $5 \times 10^{19}$ cm$^{-3}$ or smaller. Further, growth layer 30 has an impurity concentration of, for example, $5 \times 10^{16}$ cm$^{-3}$ or greater and $5 \times 10^{21}$ cm$^{-3}$ or smaller. As the impurity, nitrogen or phosphorus can be used, for example. It should be noted that the impurity included in growth layer 30 and the impurity included in each of SiC substrates 11 and 12 may be different from each other.

Further, preferably, front-side surface F1 has an off angle of 50° or greater and 65° or smaller relative to the {0001} plane of SiC substrate 11 and front-side surface F2 has an off angle of 50° or greater and 65° or smaller relative to the {0001} plane of the SiC substrate.

More preferably, the off orientation of front-side surface F1 forms an 5° or smaller relative to the <1-100> direction of SiC substrate 11, and the off orientation of front-side surface F2 forms an angle of 5° or smaller with the <1-100> direction of substrate 12.

Further preferably, front-side surface F1 has an off angle of −3° or greater and 5° or smaller relative to the {03-38} plane in the <1-100> direction of SiC substrate 11, and front-side surface F2 has an off angle of −3° or greater and 5° or smaller relative to the {03-38} plane in the <1-100> direction of SiC substrate 12.

It should be noted that the "off angle of surface F1 relative to the {03-38} plane in the <1-100> direction" refers to an angle formed by an orthogonal projection of a normal line of front-side surface F1 to a projection plane defined by the <1-100> direction and the <0001> direction, and a normal line of the {03-38} plane. The sign of positive value corresponds to a case where the orthogonal projection approaches in parallel with the <1-100> direction whereas the sign of negative value corresponds to a case where the orthogonal projection approaches in parallel with the <0001> direction. This is similar in the "off angle of front-side surface F2 relative to the {03-38} plane in the <1-100> direction".

Further, the off orientation of front-side surface F1 forms an angle of 5° or smaller with the <11-20> direction of substrate 11. The off orientation of front-side surface F2 forms an angle of 5° or smaller with the <11-20> direction of substrate 12.

According to the present embodiment, as shown in FIG. 2, SiC substrates 11 and 12 are combined as one semiconductor substrate 80 through connecting portion 50. Semiconductor substrate 80 includes respective front-side surfaces F1 and F2 of the SiC substrates, as a substrate surface on which a semiconductor device such as a transistor is to be formed. In other words, semiconductor substrate 80 has a larger substrate surface than in the case where any of SiC substrates 11 and 12 is solely used. Thus, semiconductor substrate 80 allows semiconductor devices employing SiC to be manufactured efficiently.

In addition, since growth layer 30 formed on back-side surfaces B1 and B2 is also made of SiC as with SiC substrates 11 and 12, physical properties of the SiC substrates and growth layer 30 are close to one another. Accordingly, warpage or cracks of semiconductor substrate 80 resulting from a difference in physical property therebetween can be suppressed.

Further, utilization of the sublimation method allows growth layer 30 to be formed fast with high quality. When the sublimation method thus utilized is the close-spaced sublimation method, growth layer 30 can be formed more uniformly.

Further, when the average value of space D1 (FIG. 5) between each of back-side surfaces B1 and B2 and the surface of solid raw material 20 is 1 cm or smaller, distribution in film thickness of growth layer 30 can be reduced. Furthermore, when the average value of space D1 is 1 mm or smaller, the distribution in film thickness of growth layer 30 can be reduced further. So far as the average value of space D1 is 1 μm or greater, a space for sublimation of SiC can be sufficiently secured.

Meanwhile, in the step of forming growth layer 30 (FIG. 7), the temperatures of SiC substrates 11 and 12 are set lower than that of solid raw material 20 (FIG. 5). This allows the sublimated SiC to be efficiently solidified on SiC substrates 11 and 12.

Further, the step of forming growth layer 30 (FIG. 5-FIG. 7) is performed to allow growth layer 30 to connect back-side surfaces B1 and B2 to each other. This allows SiC substrates 11 and 12 to be connected only by growth layer 30. In other words, SiC substrates 11 and 12 are connected by such a homogeneous material.

Further, the step of placing SiC substrates 11 and 12 is preferably performed to allow the minimum space between SiC substrates 11 and 12 to be 1 mm or smaller. Accordingly, growth layer 30 can be formed to connect back-side surface B1 of SiC substrate 11 and back-side surface B2 of SiC substrate 12 to each other more securely.

Further, growth layer 30 preferably has a single-crystal structure. Accordingly, growth layer 30 has physical properties close to the physical properties of SiC substrates 11 and 12 each having a single-crystal structure.

More preferably, growth layer 30 on back-side surface B1 has a crystal plane inclined by 10° or smaller relative to that of back-side surface B1. Further, growth layer 30 on back-side surface B2 has a crystal plane inclined by 10° or smaller relative to that of back-side surface B2. Accordingly, growth layer 30 has anisotropy close to that of each of SiC substrates 11 and 12.

Further, preferably, each of SiC substrates 11 and 12 has an impurity concentration different from that of growth layer 30. Accordingly, there can be obtained semiconductor substrate 80 (FIG. 2) having a structure of two layers with different impurity concentrations.

Furthermore, the impurity concentration in growth layer 30 is preferably higher than the impurity concentration in each of SiC substrates 11 and 12. This allows the resistivity of growth layer 30 to be smaller than those of SiC substrates 11 and 12. Accordingly, there can be obtained semiconductor substrate 80 suitable for manufacturing of a semiconductor device in which a current flows in the thickness direction of growth layer 30, i.e., a semiconductor device of vertical type.

Meanwhile, preferably, front-side surface F1 has an off angle of not less than 50° and not more than 65° relative to the {0001} plane of SiC substrate 11 and front-side surface F2 has an off angle of not less than 50° and not more than 65° relative to the {0001} plane of SiC substrate 12. Accordingly, channel mobility can be higher in each of front-side surfaces F1 and F2 than in the case where each of front-side surfaces F1 and F2 corresponds to the {0001} plane.

More preferably, the off orientation of front-side surface F1 forms an angle of not more than 5° with the <1-100> direction of SiC substrate 11, and the off orientation of front-side surface F2 forms an angle of not more than 5° with the <1-100> direction of SiC substrate 12. This allows for higher channel mobility in each of front-side surfaces F1 and F2.

Further, front-side surface F1 preferably has an off angle of not less than −3° and not more than 5° relative to the {03-38} plane in the <1-100> direction of SiC substrate 11, and front-side surface F2 preferably has an off angle of not less than −3° and not more than 5° relative to the {03-38} plane in the <1-100> direction of SiC substrate 12. This allows for further higher channel mobility in each of front-side surfaces F1 and F2.

Further, preferably, the off orientation of front-side surface F1 forms an angle of not more than 5° with the <11-20> direction of SiC substrate 11, and the off orientation of front-side surface F2 forms an angle of not more than 5° with the <11-20> direction of SiC substrate 12. This allows for higher channel mobility in each of front-side surfaces F1 and F2 than in the case where each of the front-side surfaces F1 and F2 corresponds to the {0001} plane.

In the description above, the SiC wafer is exemplified as solid raw material 20, but solid raw material 20 is not limited to this and may be a SiC powder or a SiC sintered compact, for example.

Further, as first and second heating bodies 81, 82, any heating bodies can be used as long as they are capable of heating a target object. For example, the heating bodies can be of resistive heating type employing a graphite heater, or of inductive heating type.

Meanwhile, in FIG. 5, the space is provided between each of back-side surfaces B1 and B2 and surface SS of solid raw material 20 to extend therealong entirely. However, in the present specification, the expression "space is provided" has a broader meaning to indicate that the space has an average value of more than zero. Hence, the expression may encompass a case where a space is provided between each of back-side surfaces B1 and B2 and surface SS of solid raw material 20 while each of back-side surface B1 and B2 and surface SS of solid raw material 20 are partially in contact with each other. The following describes two variations corresponding to this case.

Figure 9:
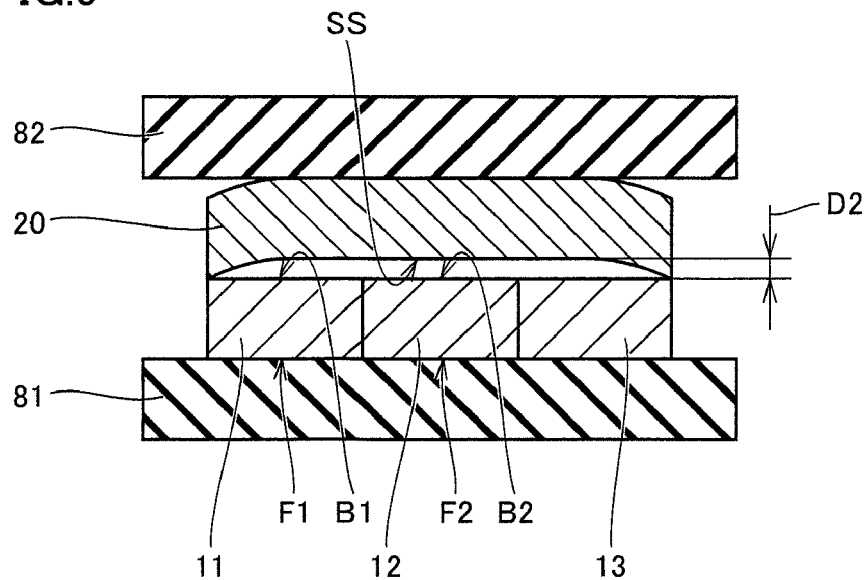
FIG. 9 is a cross sectional view schematically showing a second variation of the first step of the method for manufacturing the semiconductor substrate in the first embodiment of the present invention.

Referring to FIG. 9, in a variation thereof, the space is secured by warpage of the SiC wafer serving as solid raw material 20. More specifically, in the present variation, there is provided a space D2 that is locally zero but surely has an average value exceeding zero. Meanwhile, preferably, as with the average value of space D1, the average value of space D2 is set to be smaller than the mean free path for the sublimation gas in the sublimation method. For example, the average value is not less than 1 μm and not more than 1 cm.

Figure 10:
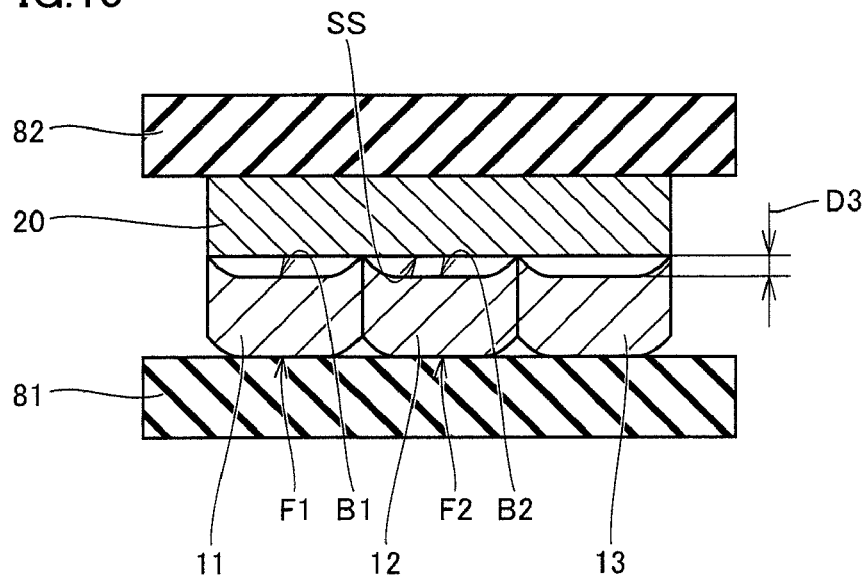
FIG. 10 is a cross sectional view schematically showing a third variation of the first step of the method for manufacturing the semiconductor substrate in the first embodiment of the present invention.

Referring to FIG. 10, in a variation thereof, the space is secured by warpage of each of SiC substrates 11-13. More specifically, in the present variation, there is provided a space D3 that is locally zero but surely has an average value exceeding zero. Meanwhile, preferably, as with the average value of space D1, the average value of space D3 is set to be smaller than the mean free path for the sublimation gas in the sublimation method. For example, the average value is not less than 1 μm and not more than 1 cm.

In addition, the space may be secured by combination of the respective methods shown in FIG. 9 and FIG. 10, i.e., by both the warpage of the SiC wafer serving as solid raw material 20 and the warpage of each of SiC substrates 11-13.

Each of the methods shown in FIG. 9 and FIG. 10 or the combination of these methods is particularly effective when the average value of the space is not more than 100 μm.

Explained next are results of reviewing manufacturing conditions suitable for the manufacturing of semiconductor substrate 80 described above.

Reviewed first was each substrate temperature of SiC substrates 11, 12 upon the formation of growth layer 30. It should be noted that pressure in the treatment room was reduced from the atmospheric pressure by exhausting air therefrom using a vacuum pump, and was maintained at 1 Pa. Further, space D1 (FIG. 5) between each of back-side surfaces B1 and B2 and surface SS of solid raw material 20 was set at 50 μm. Furthermore, the temperatures of SiC substrates 11, 12 were set to be lower than the temperature of solid raw material 20 by 100° C. Results thereof are shown below.

TABLE 1

| 1600° C. | 1800° C. | 2000° C. | 2500° C. | 3000° C. |
|---|---|---|---|---|
| Not Combined | Good | Good | Good | Decreased Crystallinity in Substrate |

From these results, it was found that in order to combine SiC substrates 11 and 12 with each other, the substrate temperature of 1600° C. is too low and the substrate temperature of 1800° C. or greater is preferable. It was also found that in order to avoid decreased crystallinity in the substrates, the substrate temperature of 3000° C. is too high and the substrate temperature of 2500° C. or smaller is preferable. As such, it was found that the substrate temperature is preferably not less than 1800° C. and not more than 2500° C.

Reviewed second was how low the temperature of each of SiC substrates 11, 12 should be set relative to the temperature of solid raw material 20, i.e., a difference in temperature therebetween. It should be noted that the pressure in the treatment room was reduced from the atmospheric pressure by exhausting air therefrom using the vacuum pump, and was maintained at 1 Pa. Further, the substrate temperature was fixed to 2000° C. Further, space D1 (FIG. 5) between each of back-side surfaces B1 and B2 and surface SS of solid raw material 20 was set at 50 µm. Results thereof are shown below.

TABLE 2

| 0.1° C. | 1° C. | 10° C. | 100° C. | 500° C. |
|---|---|---|---|---|
| Small Growth Rate | Good | Good | Good | Large Distribution in Film Thickness |

From these results, it was found that in order to secure sufficient growth rate of growth layer 30, the difference in temperature therebetween is too small when it is 0.1° C., and is preferable when it is 1° C. or higher. It was also found that in order to suppress distributed film thickness of growth layer 30, the difference in temperature therebetween is too large when it is 500° C., and is preferable when it is 100° C. or smaller. As such, it was found that the difference in temperature therebetween is preferably not less than 1° C. and not more than 100° C.

Reviewed third was the pressure in the atmosphere upon the formation of growth layer 30. It should be noted that the above-described difference in temperature therebetween was set at 100° C. Further, the substrate temperature was fixed at 2000° C. Further, space D1 (FIG. 5) between each of back-side surfaces B1 and B2 and surface SS of solid raw material 20 was set at 50 µm. Results thereof are shown below.

TABLE 3

| 100 kPa | 10 kPa | 1 kPa | 100 Pa | 1 Pa | 0.1 Pa |
|---|---|---|---|---|---|
| Not Combined | Low Strength in Combined Substrates | Good | Good | Good | Good |

From these results, it was found that in order to combine SiC substrates 11 and 12 with each other, the pressure is too high when it is 100 kPa, and is preferable when it is 50 kPa or lower, and is particularly preferable when it is 10 kPa or lower.

Reviewed fourth was space D1 (FIG. 5) between each of back-side surfaces B1 and B2 and surface SS of solid raw material 20. It should be noted that the pressure in the treatment room was reduced from the atmospheric pressure by exhausting air therefrom using the vacuum pump, and was maintained at 1 Pa. Further, the substrate temperature was fixed at 2000° C. The above-described difference in temperature was set at 50° C.

As a result, when space D1=5 cm, distribution in film thickness of growth layer 30 was too large, while when space D1=1 cm, 1 mm, 500 or 1 µm, distribution in film thickness of growth layer 30 could be sufficiently small. As such, it was found that in order to achieve sufficiently small distribution in the film thickness of growth layer 30, space D1 is preferably 1 cm or smaller.

It is considered that an appropriate value for space D1 is associated with the mean free path for the sublimation gas in the sublimation method. Specifically, it is considered preferable that the average value of space D1 be set smaller than this mean free path. For example, realistically, space D1 is preferably of several cm or smaller because a mean free path for atoms and molecules is approximately several cm to several ten cm at a pressure of 1 Pa and a temperature of 2000° C., although the mean free path depends on atomic radius and molecule radius.

Reviewed fifth was the roughness of each of back-side surfaces B1 and B2. It should be noted that the pressure in atmosphere was set at 1 Pa and the substrate temperature was set at 2000° C. As a result, when roughness Ra was Ra=500 µm, large irregularities were generated at the surface of growth layer 30, while when Ra=100 µm, 1 µm, or 0.1 nm, the irregularities were sufficiently small. As such, it was found that in order to obtain sufficiently small irregularities at the surface of growth layer 30, the roughness of each of back-side surfaces B1 and B2 are not more than 100 µm. In addition, in the case where each of back-side surfaces B1 and B2 was a so-called "as-sliced surface", the irregularities were sufficiently small.

In addition, it was also confirmed that the following exemplary conditions can be adopted without any problem with the pressure in atmosphere being at 1 Pa and the substrate temperature being at 2000° C.

Times usable for the formation of growth layer 30 were one minute, one hour, three hours, or 24 hours. As the atmospheric gas, there can be used inactive gas atmosphere employing He, Ar, $N_2$, or $N_2$ of 60% concentration. Also, instead of the inactive gas atmosphere, atmosphere obtained by reducing the pressure of the atmospheric air was usable. Further, solid raw material 20 (FIG. 5) could be used in the form of a single crystal, a polycrystal, a sintered compact, or a SiC powder. Furthermore, in the case where each of SiC substrates 11 and 12 have a plane orientation of (03-38), a plane orientation of (0001), (03-38), (11-20), or (1-100) could be used as the plane orientation of surface SS (FIG. 5) of solid raw material 20. Further, as the impurity in solid raw material 20 (FIG. 5), nitrogen or phosphorus could be used at a concentration of $5 \times 10^{15}$ cm$^{-3}$, $8 \times 10^{18}$ cm$^{-3}$ or $5 \times 10^{21}$ cm$^{-3}$. Further, in the case where each of SiC substrates 11 and 12 has a polytype of 4H, a polytype of 4H, 6H, 15R, or 3C could be used as the polytype of solid raw material 20.

Second Embodiment

Figure 11:
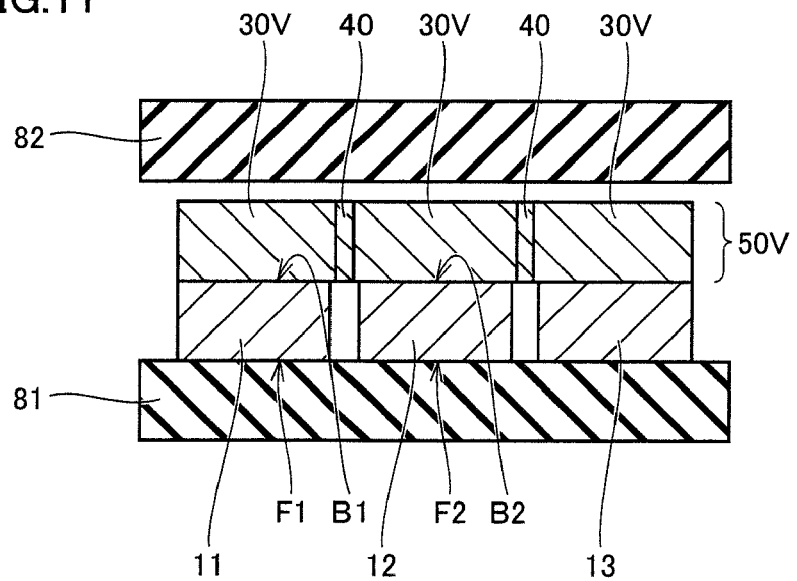
FIG. 11 is a cross sectional view schematically showing one step of a method for manufacturing a semiconductor substrate in a second embodiment of the present invention.

Referring to FIG. 11, in the present embodiment, a connecting portion 50V is constituted by growth layers 30V and interlayers 40. Growth layers 30V are formed using the sublimation method in substantially the same manner as growth layer 30 (FIG. 7) of the first embodiment, but are different from growth layer 30 in that they are formed separately on SiC substrates 11 and 12. Growth layers 30V are connected to one another via interlayers 40 made of SiC. Interlayers 40 were portions of solid raw material 20 remaining and not sublimated.

Apart from the configuration described above, the configuration of the second embodiment is substantially the same as the configuration of the first embodiment. Hence, the same or corresponding elements are given the same reference characters and are not described repeatedly.

According to the present embodiment, even though growth layers 30V on SiC substrates 11 and 12 are not directly connected to one another, back-side surfaces B1 and B2 can be connected to each other by connecting portion 50V having growth layers 30V and interlayers 40.

Further, in the present embodiment, as solid raw material 20, it is preferable to use a piece of solid matter of SiC such as a SiC wafer, rather than a powder thereof. Accordingly, interlayers 40, which are the portions of solid raw material 20, are in a solid form rather than a powder form. Hence, adjacent growth layers 30V can be connected by such solid matters rather than powders. This allows adjacent growth layers 30V to be connected to each other with sufficient strength.

Figure 12:
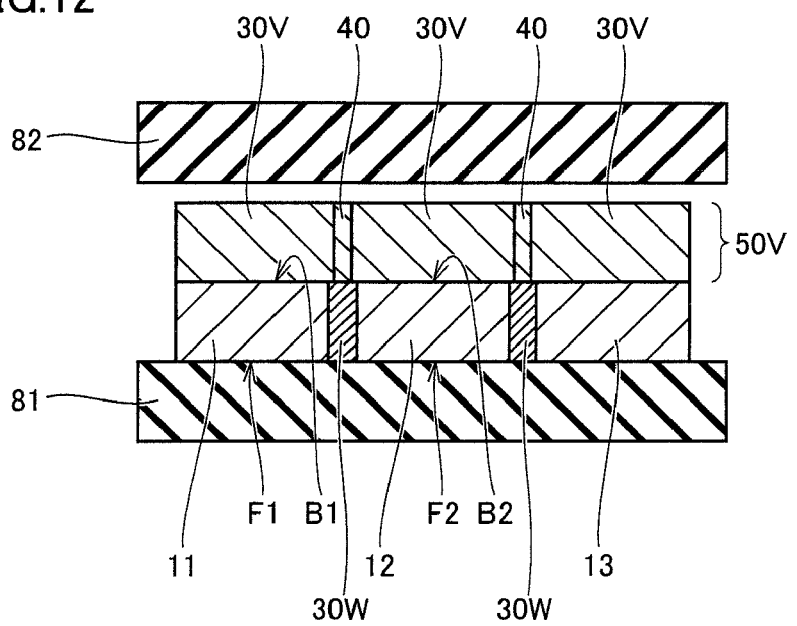
FIG. 12 is a cross sectional view schematically showing a variation of the step shown in FIG. 11.

It should be noted that a space between the plurality of SiC substrates (for example, SiC substrates 11 and 12) may be filled with a filling portion 30W (FIG. 12), which is formed by sublimation and recrystallization of SiC. Filling portion 30W thus formed allows the plurality of SiC substrates to be connected to one another more firmly.

Third Embodiment

Figure 13:
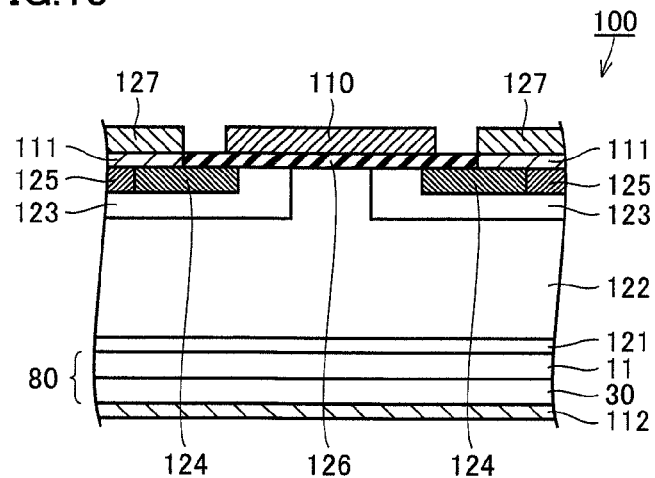
FIG. 13 is a partial cross sectional view schematically showing a configuration of a semiconductor device in a third embodiment of the present invention.

Referring to FIG. 13, a semiconductor device 100 of the present embodiment is a DiMOSFET (Double Implanted Metal Oxide Semiconductor Field Effect Transistor) of vertical type, and has a substrate 80, a buffer layer 121, a withstand voltage holding layer 122, p regions 123, $n^+$ regions 124, $p^+$ regions 125, an oxide film 126, source electrodes 111, upper source electrodes 127, a gate electrode 110, and a drain electrode 112.

In the present embodiment, substrate 80 has n type conductivity, and has growth layer 30 and SiC substrate 11 as described in the first embodiment. Drain electrode 112 is provided on growth layer 30 to interpose growth layer 30 between drain electrode 112 and SiC substrate 11. Buffer layer 121 is provided on SiC substrate 11 to interpose SiC substrate 11 between buffer layer 121 and growth layer 30.

Buffer layer 121 has n type conductivity, and has a thickness of, for example, 0.5 µm. Further, impurity with n type conductivity in buffer layer 121 has a concentration of, for example, $5\times10^{17}$ cm$^{-3}$.

Withstand voltage holding layer 122 is formed on buffer layer 121, and is made of silicon carbide with n type conductivity. For example, withstand voltage holding layer 122 has a thickness of 10 µm, and includes a conductive impurity of n type at a concentration of $5\times10^{15}$ cm$^{-3}$.

Withstand voltage holding layer 122 has a surface in which the plurality of p regions 123 of p type conductivity are formed with spaces therebetween. In each of p regions 123, an $n^+$ region 124 is formed at the surface layer of p region 123. Further, at a location adjacent to $n^+$ region 124, a $p^+$ region 125 is formed. An oxide film 126 is formed to extend on $n^+$ region 124 in one p region 123, p region 123, an exposed portion of withstand voltage holding layer 122 between the two p regions 123, the other p region 123, and $n^+$ region 124 in the other p region 123. On oxide film 126, gate electrode 110 is formed. Further, source electrodes 111 are formed on $n^+$ regions 124 and $p^+$ regions 125. On source electrodes 111, upper source electrodes 127 are formed.

The concentration of nitrogen atoms is not less than $1\times10^{21}$ cm$^{-3}$ in maximum value at a region of 10 nm or smaller from the interface between oxide film 126 and each of the semiconductor layers, i.e., $n^+$ regions 124, $p^+$ regions 125, p regions 123, and withstand voltage holding layer 122. This achieves improved mobility particularly in a channel region below oxide film 126 (a contact portion of each p region 123 with oxide film 126 between each of $n^+$ regions 124 and withstand voltage holding layer 122).

The following describes a method for manufacturing a semiconductor device 100. It should be noted that FIG. 15-FIG. 18 show steps only in the vicinity of SiC substrate 11 of SiC substrates 11-19 (FIG. 1), but the same steps are performed also in the vicinity of each of SiC substrates 12-19.

Figure 14:
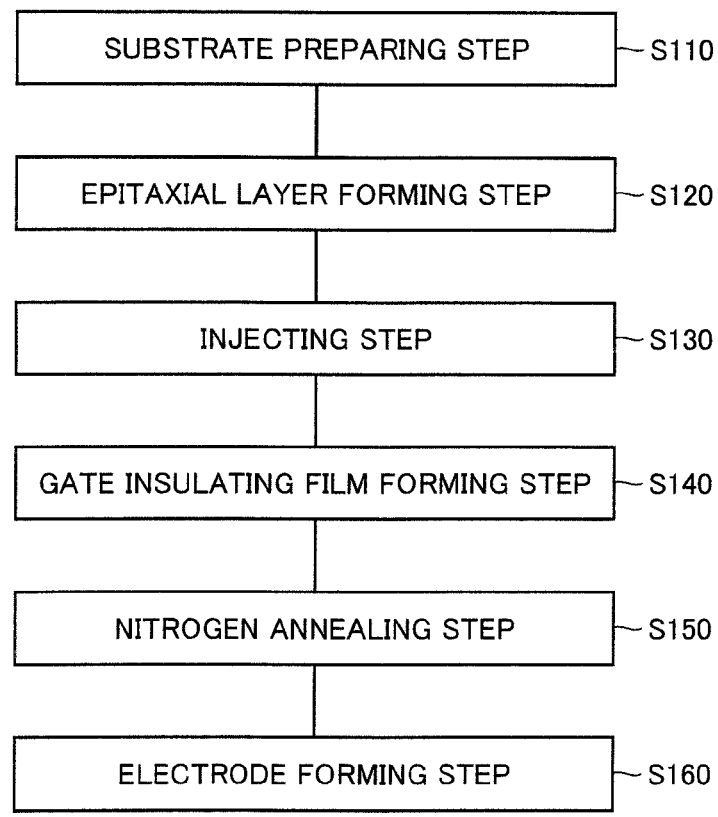
FIG. 14 is a schematic flowchart of a method for manufacturing the semiconductor device in the third embodiment of the present invention.

First, in a substrate preparing step (step S110: FIG. 14), semiconductor substrate 80 (FIG. 1 and FIG. 2) is prepared. Specifically, semiconductor substrate 80 is formed by steps S10-S30 (FIG. 3: the first embodiment). Semiconductor substrate 80 has n type conductivity.

Figure 15:
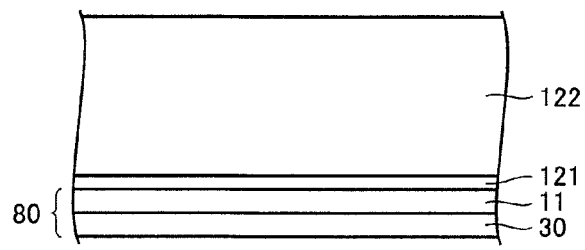
FIG. 15 is a partial cross sectional view schematically showing a first step of the method for manufacturing the semiconductor device in the third embodiment of the present invention.

Referring to FIG. 15, in an epitaxial layer forming step (step S120: FIG. 14), buffer layer 121 and withstand voltage holding layer 122 are formed as follows.

First, buffer layer 121 is formed on SiC substrate 11 of substrate 80. Buffer layer 121 is made of silicon carbide of n type conductivity, and is an epitaxial layer having a thickness of 0.5 µm, for example. Buffer layer 121 has a conductive impurity at a concentration of, for example, $5\times10^{17}$ cm$^{-3}$.

Next, withstand voltage holding layer 122 is formed on buffer layer 121. Specifically, a layer made of silicon carbide of n type conductivity is formed using an epitaxial growth method. Withstand voltage holding layer 122 has a thickness of, for example, 10 µm. Further, withstand voltage holding layer 122 includes an impurity of n type conductivity at a concentration of, for example, $5\times10^{15}$ cm$^{-3}$.

Figure 16:
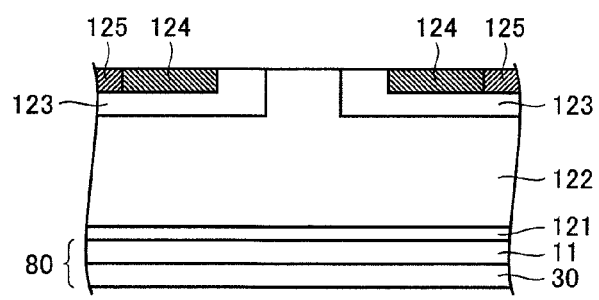
FIG. 16 is a partial cross sectional view schematically showing a second step of the method for manufacturing the semiconductor device in the third embodiment of the present invention.

Referring to FIG. 16, an injecting step (step S130: FIG. 14) is performed to form p regions 123, $n^+$ regions 124, and $p^+$ regions 125 as follows.

First, an impurity of p type conductivity is selectively injected into portions of withstand voltage holding layer 122, thereby forming p regions 123. Then, a conductive impurity of n type is selectively injected to predetermined regions to form $n^+$ regions 124, and a conductive impurity of p type is selectively injected into predetermined regions to form $p^+$ regions 125. It should be noted that such selective injection of the impurities is performed using a mask formed of, for example, an oxide film.

After such an injecting step, an activation annealing treatment is performed. For example, the annealing is performed in argon atmosphere at a heating temperature of 1700° C. for 30 minutes.

Figure 17:
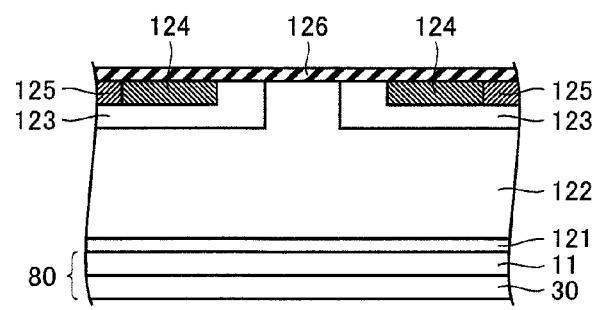
FIG. 17 is a partial cross sectional view schematically showing a third step of the method for manufacturing the semiconductor device in the third embodiment of the present invention.

Referring to FIG. 17, a gate insulating film forming step (step S140: FIG. 14) is performed. Specifically, oxide film 126 is formed to cover withstand voltage holding layer 122, p regions 123, $n^+$ regions 124, and $p^+$ regions 125. Oxide film 126 may be formed through dry oxidation (thermal oxidation). Conditions for the dry oxidation are, for example, as follows: the heating temperature is 1200° C. and the heating time is 30 minutes.

Thereafter, a nitrogen annealing step (step S150) is performed. Specifically, annealing treatment is performed in nitrogen monoxide (NO) atmosphere. Conditions for this treatment are, for example, as follows: the heating temperature is 1100° C. and the heating time is 120 minutes. As a result, nitrogen atoms are introduced into a vicinity of the interface between oxide film 126 and each of withstand voltage holding layer 122, p regions 123, $n^+$ regions 124, and $p^+$ regions 125.

It should be noted that after the annealing step using nitrogen monoxide, additional annealing treatment may be performed using argon (Ar) gas, which is an inert gas. Conditions for this treatment are, for example, as follows: the heating temperature is 1100° C. and the heating time is 60 minutes.

Figure 18:
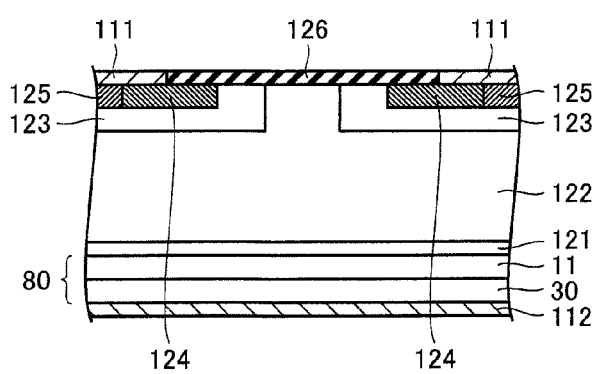
FIG. 18 is a partial cross sectional view schematically showing a fourth step of the method for manufacturing the semiconductor device in the third embodiment of the present invention.

Referring to FIG. 18, an electrode forming step (step S160: FIG. 14) is performed to form source electrodes 111 and drain electrode 112 in the following manner.

First, a resist film having a pattern is formed on oxide film 126, using a photolithography method. Using the resist film as a mask, portions above $n^+$ regions 124 and $p^+$ regions 125 in oxide film 126 are removed by etching. In this way, openings are formed in oxide film 126. Next, in each of the openings, a conductive film is formed in contact with each of $n^+$ regions 124 and $p^+$ regions 125. Then, the resist film is removed, thus removing the conductive film's portions located on the resist film (lift-off). This conductive film may be a metal film, for example, may be made of nickel (Ni). As a result of the lift-off, source electrodes 111 are formed.

It should be noted that on this occasion, heat treatment for alloying is preferably performed. For example, the heat treatment is performed in atmosphere of argon (Ar) gas, which is an inert gas, at a heating temperature of 950° C. for two minutes.

Referring to FIG. 13 again, upper source electrodes 127 are formed on source electrodes 111. Further, drain electrode 112 is formed on the back-side surface of substrate 80. Further, gate electrode 110 is formed on oxide film 126. In this way, semiconductor device 100 is obtained.

It should be noted that a configuration may be employed in which conductive types are opposite to those in the present embodiment. Namely, a configuration may be employed in which p type and n type are replaced with each other.

Further, the semiconductor substrate for use in fabricating semiconductor device 100 is not limited to semiconductor substrate 80 of the first embodiment, and may be, for example, the semiconductor substrate obtained according to the second embodiment.

Further, the DiMOSFET of vertical type has been exemplified, but another semiconductor device may be manufactured using the semiconductor substrate of the present invention. For example, a RESURF-JFET (Reduced Surface Field-Junction Field Effect Transistor) or a Schottky diode may be manufactured.

In summary, the semiconductor substrate of the present embodiment is manufactured in the following method for manufacturing.

There are prepared a first silicon carbide substrate having a first front-side surface and a first back-side surface opposite to each other and having a single-crystal structure, and a second silicon carbide substrate having a second front-side surface and a second back-side surface opposite to each other and having a single-crystal structure. The first and second silicon carbide substrates are placed so as to expose each of the first and second back-side surfaces in one direction. A connecting portion is formed for connecting the first and second back-side surfaces to each other. The step of forming the connecting portion includes a step of forming a growth layer made of silicon carbide on each of the first and second back-side surfaces, using a sublimation method of supplying a sublimate thereto in the one direction.

Further, the semiconductor device of the present embodiment is fabricated using a semiconductor substrate fabricated using the following method for manufacturing.

There are prepared a first silicon carbide substrate having a first front-side surface and a first back-side surface opposite to each other and having a single-crystal structure, and a second silicon carbide substrate having a second front-side surface and a second back-side surface opposite to each other and having a single-crystal structure. The first and second silicon carbide substrates are placed so as to expose each of the first and second back-side surfaces in one direction. A connecting portion is formed for connecting the first and second back-side surfaces to each other. The step of forming the connecting portion includes a step of forming a growth layer made of silicon carbide on each of the first and second back-side surfaces, using a sublimation method of supplying a sublimate thereto in the one direction.

It should be considered that the embodiments disclosed herein are illustrative and non-restrictive in any respect. The scope of the present invention is defined by the scope of claims rather than the description above, and is intended to include any modifications within the scope and meaning equivalent to the terms of the claims.

Industrial Applicability

A method for manufacturing a semiconductor substrate in the present invention is advantageously applicable particularly to a method for manufacturing a semiconductor substrate including a portion made of silicon carbide having a single-crystal structure.

Description Of The Reference Signs

11: SiC substrate (first silicon carbide substrate); 12: SiC substrate (second silicon carbide substrate); 13-19: SiC substrate; 20, 20p: solid raw material; 30, 30p, 30V: growth layer; 30W: filling portion; 40: interlayer; 50, 50V: connecting portion; 80: semiconductor substrate; 81: first heating body; 82: second heating body; 100: semiconductor device.

The invention claimed is:

1. A method for manufacturing a semiconductor substrate, comprising the steps of:

preparing a first silicon carbide substrate having a first front-side surface and a first back-side surface opposite to each other and having a single-crystal structure, and a second silicon carbide substrate having a second front-side surface and a second back-side surface opposite to each other and having a single-crystal structure;

placing said first and second silicon carbide substrates so as to expose each of said first and second back-side surfaces in one direction; and forming a connecting portion for connecting said first and second back-side surfaces to each other, the step of forming said connecting portion including a step of forming a growth layer made of silicon carbide on each of said first and second back-side surfaces, using a sublimation method of supplying a sublimate thereto in said one direction.

2. The method for manufacturing the semiconductor substrate according to claim 1, wherein:

the step of forming said growth layer includes the steps of arranging each of said first and second back-side surfaces exposed in said one direction, and a surface of a solid raw material so as to face each other with a space provided therebetween, said solid raw material being disposed in said one direction relative to said first and second back-side surfaces and made of silicon carbide, generating a gas by sublimating the silicon carbide at the surface of said solid raw material, and solidifying said gas on each of said first and second back-side surfaces.

3. The method for manufacturing the semiconductor substrate according to claim 2, wherein said space has an average value smaller than a mean free path for a sublimation gas in said sublimation method.

4. The method for manufacturing the semiconductor substrate according to claim 2, wherein in the step of forming said growth layer, each of said first and second silicon carbide substrates has a temperature set to be lower than that of said solid raw material.

5. The method for manufacturing the semiconductor substrate according to claim 2, wherein said solid raw material is a piece of solid matter of silicon carbide.

6. The method for manufacturing the semiconductor substrate according to claim 1, wherein the step of placing is performed to allow a minimum space between said first and second silicon carbide substrates to be not more than 1 mm.

7. The method for manufacturing the semiconductor substrate according to claim 1, wherein said growth layer has a single-crystal structure.

8. The method for manufacturing the semiconductor substrate according to claim 7, wherein:
said growth layer on said first back-side surface has a crystal plane inclined by 10° or smaller relative to a crystal plane of said first back-side surface, and
said growth layer on said second back-side surface has a crystal plane inclined by 10° or smaller relative to a crystal plane of said second back-side surface.

9. The method for manufacturing the semiconductor substrate according to claim 1, wherein each of said first and second silicon carbide substrates has an impurity concentration different from an impurity concentration in said growth layer.

10. The method for manufacturing the semiconductor substrate according to claim 1, wherein said growth layer has an impurity concentration higher than an impurity concentration of each of said first and second silicon carbide substrates.

11. The method for manufacturing the semiconductor substrate according to claim 1, wherein said first front-side surface has an off angle of not less than 50° and not more than 65° relative to a {0001} plane of said first silicon carbide substrate, and said second front-side surface has an off angle of not less than 50° and not more than 65° relative to a {0001} plane of said second silicon carbide substrate.

12. The method for manufacturing the semiconductor substrate according to claim 11, wherein said first front-side surface has an off orientation forming an angle of not more than 5° with a <1-100>direction of said first silicon carbide substrate, and said second front-side surface has an off orientation forming an angle of not more than 5° with a <1-100>direction of said second silicon carbide substrate.

13. The method for manufacturing the semiconductor substrate according to claim 12, wherein said first front-side surface has an off angle of not less than −3° not more than 5° relative to a {03-38} plane in the <1-100>direction of said first silicon carbide substrate, and said second front-side surface has an off angle of not less than −3° not more than 5° relative to a {03-38} plane in the <1-100>direction of said second silicon carbide substrate.

14. The method for manufacturing the semiconductor substrate according to claim 11, wherein said first front-side surface has an off orientation forming an angle of not more than 5° with a <11-20>direction of said first silicon carbide substrate, and said second front-side surface has an off orientation forming an angle of not more than 5° with a <11-20>direction of said second silicon carbide substrate.

15. The method for manufacturing the semiconductor substrate according to claim 1, wherein the step of forming said growth layer is performed in atmosphere obtained by reducing pressure of atmospheric air.

16. The method for manufacturing the semiconductor substrate according to claim 1, wherein the step of forming said growth layer is performed in atmosphere having a pressure higher than $10^{-1}$ Pa and lower than $10^4$ Pa.

17. The method for manufacturing the semiconductor substrate according to claim 1, wherein each of said first and second back-side surfaces is a surface obtained by slicing.

* * * * *